(12) United States Patent
Leunissen et al.

(10) Patent No.: US 7,695,877 B2
(45) Date of Patent: Apr. 13, 2010

(54) METHODS AND DEVICES FOR LITHOGRAPHY USING ELECTROMAGNETIC RADIATION WITH SHORT WAVELENGTHS

(75) Inventors: Leonardus Leunissen, Hamme-Mille (BE); Roel Gronheid, Boutersem (BE)

(73) Assignee: IMEC, Leuven (BE)

( * ) Notice: Subject to any disclaimer, the term of this patent is extended or adjusted under 35 U.S.C. 154(b) by 558 days.

(21) Appl. No.: 11/636,361

(22) Filed: Dec. 8, 2006

(65) Prior Publication Data

US 2007/0154817 A1 Jul. 5, 2007

(30) Foreign Application Priority Data

Dec. 9, 2005 (EP) .................................. 05447289

(51) Int. Cl.
*G03C 5/00* (2006.01)
*G03F 1/00* (2006.01)
*G06K 9/20* (2006.01)
*G01N 21/00* (2006.01)
*F21V 9/04* (2006.01)

(52) U.S. Cl. ............................. 430/30; 430/5; 382/144; 356/237.5; 359/359

(58) Field of Classification Search .................... 430/5, 430/30; 382/144; 356/237.5; 359/359
See application file for complete search history.

(56) References Cited

U.S. PATENT DOCUMENTS

| 6,872,495 | B2 | 3/2005 | Schwarzl | |
| 2004/0137677 | A1* | 7/2004 | Lowisch et al. | 438/232 |
| 2004/0157136 | A1* | 8/2004 | Chandhok et al. | 430/5 |

OTHER PUBLICATIONS

Leonardus H. A. Leunissen, Roel Gronheid, and Weimin Gao "Iso-sciatic point: novel approach to distinguish shadowing 3-D mask effects from scanner aberrations in extreme ultraviolet lithography," Jun. 21, 2006, Proc. SPIE 6281, 628106 (2006).*
Krautschik, et al., The Impact of the EUV Phase Response on the Asymmetry of Bossung Curves as Predicted by Rigorous EUV Mask Simulations, Emerging Lithographic Technologies V, Feb. 27, 2001, Proceedings of the SPIE 2001, vol. 4343, pp. 392-401.
Yan, et al., Understanding Bossung Curve Asymmetry and Focus Shift Effect in EUV Lithography, 21st Annual BACUS Symposium on Photomask Technology, Mar. 2002, Proceedings of SPIE 2002, vol. 4562, pp. 279-287.

* cited by examiner

*Primary Examiner*—Mark F Huff
*Assistant Examiner*—Jonathan Jelsma
(74) *Attorney, Agent, or Firm*—Knobbe Martens Olsen & Bear LLP

(57) ABSTRACT

One inventive aspect relates to a method of lithographic processing of a device). The method may be performed using a lithographic processing system and applying a reticle). Lithographic processing of a device typically is characterized by focus conditions, a set of selectable lithographic processing system parameter values and selectable reticle parameter values. The method of configuring the lithographic processing comprises receiving values for the lithographic processing system parameters and for the reticle parameters. The method further comprises receiving focus conditions for the lithographic processing, the focus conditions allowing separation of image performance effects due to lithographic processing system aberrations and image performance effects due to reticle shadowing effects. The method further comprises determining image performance effects due to lithographic processing system aberrations and the image performance due to reticle shadowing effects. Furthermore, a test kit for performing a method for lithographic processing devices such as a lithographic processing system or a reticle adapted for using the method is described.

8 Claims, 12 Drawing Sheets

METHODS AND DEVICES FOR LITHOGRAPHY USING ELECTROMAGNETIC RADIATION WITH SHORT WAVELENGTHS

BACKGROUND OF THE INVENTION

1. Field of the Invention

Certain inventive aspects relate to the field of lithography. More particularly, they relate to methods and devices for characterizing, optimizing and performing lithography using electromagnetic radiation with short wavelengths, such as extreme ultraviolet lithography.

2. Description of the Related Technology

In the production of today's integrated circuits, optical lithography is one of the key techniques. The ongoing miniaturization of integrated circuits or other devices has resulted in the use of new types of lithography, e.g. in lithography using electromagnetic radiation with short wavelength. A typical example thereof is extreme ultraviolet lithography.

Whereas in conventional lithography techniques light typically is transmitted through the reticle, extreme ultraviolet lithography typically uses a reflective mask with a multi-layer coating. The illumination therefore typically is performed using an off-axis ring field illumination system that is non-telecentric with respect to the reticle side. In other words, illumination of the reticle typically is performed with a non-zero angle of incidence. By way of example, a schematic representation of a optical lithography system using a transmissive reticle is shown in FIG. 1a, while an optical lithography system using a reflective reticle is shown in FIG. 1b. FIG. 1a shows an illumination source 2, a transmissive reticle 4 and a device 6 comprising a resist layer 8. The resist layer 8 is illuminated with an illumination beam 10, modulated by the transmissive reticle 4, thus allowing to illuminate the resist in accordance with a predetermined pattern. For a system using a reflective reticle, as shown in FIG. 1b, an illumination source 22, typically an off-axis illumination system, generates an illumination beam guided to a reflective reticle 24. The illumination beam 30 is modulated by the reflective reticle 24 and reflected towards the substrate 6 comprising a resist layer 8.

In lithography applications using a transmissive reticle and lithography applications wherein the wavelength of the radiation used is substantially larger than the feature thickness on the reflective mask, typically a thin mask approximation (Kirchoff approximation) is valid. In lithography application wherein the wavelength of the radiation used is substantially of the same order of magnitude or smaller than the thickness of the reticle features 26, a thick mask approximation is to be used where light having a non-zero angle of incidence might be blocked by reticle features 26. In other words, the non-zero angle of incidence in combination with the three dimensional mask topography results in the so-called "shadowing effect". The latter is illustrated in more detail in FIG. 1c, which is an enlarged view of part A of FIG. 1b.

In Emerging Lithographic Technologies V, Proc. of SPIE 4343 (2001) 392-401, Krautschik et al. describe a comparison between a thin mask approximation and a thick mask approximation for extreme ultraviolet (EUV) lithography. It has been found that, using reflective EUV reticles, the critical dimension (CD) through focus behavior shows asymmetry and a shift in focus for thicker masks. The dependency on the angle of incidence, on the pitch, on the wavelength in the finite bandwidth of the illumination source and on the mask orientation has been studied.

In 21st Annual BACUS Symposium on Photomask Technology, Proc. of SPIE 4562 (2002) 279-287, Yan has studied the cause of the asymmetry of Bossung curves and best focus shifts for extreme ultraviolet lithography, i.e. where the thickness of the mask plays a role. It is discussed that these effects are due to a phase error at the reticle pattern edge. It furthermore has been shown that such effects may occur both for transmissive as for reflective masks. In U.S. Pat. No. 6,872,495, Schwarzl describes a method for fabricating a lithographic reflection mask for e.g. extreme ultraviolet lithography. Between the substrate and the reflection layer and/or on the side areas of the reflection layer, an absorber layer is applied allowing to reduce critical dimension changes due to shadowing of structures. The above described absorber layer allows projecting the patterned reflection layer in an undisturbed and image-faithful manner.

Furthermore, it is known that typically a number of aberrations are present in an optical system, such as a lithographic system. Spherical aberration may occur, which is the inability of the different zones of a lens/mirror to form an image all in one plane at the same distance of the lens/mirror. This typically results in the impossibility of making sharp focus. Coma may occur, which is a spherical aberration that passes light obliquely through the lens/mirror. This typically results in comet shaped images of a distant point, leading to blurred images as each detail is smeared. Astigmatism may occur, which is a non-uniform curvature of a refractive surface in an optical system resulting in blurred images as not all images are formed in the same point. Tilts in the Bossung curves, i.e. the CD behavior through focussing, also may be caused by these aberrations in the lithographic system or reticle.

SUMMARY OF CERTAIN INVENTIVE ASPECTS

It is an object of certain inventive aspects to provide improved apparatus or methods for characterizing lithographic processing and/or lithographic processing systems. It is an advantage of certain embodiments that apparatus or methods for performing lithographic processing of a device can be obtained with little aberration problems.

It is an advantage of certain inventive aspects that the imaging performance effects due to system aberrations and/or image performance effects due to reticle shadowing effect can be studied and/or optimized independently of the reticle shadowing effect respectively system aberrations. It is also an advantage that test kits are provided allowing the study and/or optimization of the imaging performance effects due to system aberrations and/or the imaging performance effects due to reticle shadowing effects for lithographic processing and/or lithographic process systems including the reticles used.

Certain inventive aspects relate to a method for characterizing lithographic processing, e.g. of a device, with a lithographic processing system using a reticle, the lithographic processing being characterized by focus conditions, a set of selectable lithographic processing system parameter values and selectable reticle parameter values, the method comprising, receiving values for the lithographic processing system parameters and for the reticle parameters, receiving focus conditions for the lithographic processing characterized by the selected values, the focus conditions comprising information expressing a critical dimension or line width as a function of focus for at least two different angles of incidence of the illumination beam with respect to the reticle and allowing separation of image performance effects due to lithographic processing system aberrations and image performance effects due to reticle shadowing effects, and determining image performance effects due to lithographic processing system aberrations and the image performance due to reticle shadowing effects independently by combining the information expressing a critical dimension or line width as a function of focus for at least two different angles of incidence of the illumination beam with respect to the reticle. The method may be performed automated. It is an advantage of certain embodiments that image performance effects and corresponding lithographic processing system aberrations can be determined independently of variations due to reticle shadowing effects and that image performance effects and corresponding reticle shadowing effects can be determined independent of variations due to system aberrations. This may allow more accurate determination and possibly correction for lithographic processing system aberrations. Determining image performance effects may comprise determining line width or critical dimension of imaged or printed lines or patterns. The radiation used in the lithographic processing may be electromagnetic radiation having a wavelength of substantially the same order of magnitude or shorter than the dimension of at least one reticle feature in the direction perpendicular to an average plane through the reticle. Determining image performance may comprise using CD-SEM. Determining image performance may comprise using scatterometry.

The lithographic processing may comprise using extreme ultraviolet radiation. The reticle may be a reflective reticle.

The lithographic processing may comprise guiding an illumination beam on the reticle, wherein the receiving focus conditions comprises determining information expressing a critical dimension or line width as a function of focus for at least two different angles of incidence of the illumination beam with respect to the reticle.

The information expressing a critical dimension or line width as a function of focus may be a Bossung curve. The angle of incidence of the illumination beam with respect to the reticle may be an effective shadowing angle.

Receiving focus conditions may comprise receiving an iso-sciatic point for the lithographic processing. The latter may be performed automated The determining image performance effects may comprise determining system related aberrations.

The determining image performance effects may comprise evaluating the image performance effects with respect to a predetermined image performance level.

The method furthermore may comprise receiving at least second values for the set of lithographic processing system parameters and the reticle parameters, receiving focus conditions allowing separation of image performance effects due to system aberrations and image performance effects due to reticle shadowing effects for the lithographic processing determined by the at least second values, determining at least one of the image performance effects due to system aberrations and the image performance effects due to reticle shadowing effects, and ranking the lithographic processing determined by the at least second values for the set of lithographic processing system parameters and the reticle parameters with respect to the lithographic processing determined by the first values for the set of lithographic processing system parameters and reticle parameters.

The latter may allow optimization of the lithographic processing system such that the system aberrations can be deduced and furthermore reduced. Such a reduction of system aberrations may be performed in an automatic and/or automated way.

Certain inventive aspects also relate to a reticle for use in a lithographic processing system, the reticle comprising a test structure, wherein the test structure comprises at least one pattern comprising an L/S grating, the at least one pattern suitable for evaluating image performance due to reticle shadowing effects and/or image performance due to lithographic processing system aberrations independently by combining the information expressing a critical dimension or line width as a function of focus for at least two different angles of incidence of the illumination beam with respect to the reticle.

The at least one pattern may comprise a plurality of sets of parallel lines, the sets of parallel lines being rotated with respect to each other.

The at least one pattern may comprise a plurality of sets of parallel lines, the sets of parallel lines being rotated with respect to each other. The rotation angle between different parallel lines may be different from 90° and may be different from 180°.

The reticle furthermore may comprise a pattern for use in a lithographic processing manufacturing step.

Certain inventive aspects also relate to a method for lithographic processing of a device using a reticle, the lithographic processing being characterized by a method for lithographic processing as described above. The method may comprise illuminating the reticle having reticle features, wherein the reticle features are determined based on image performance effects due to system aberrations or image performance effects due to shadowing effects.

Certain inventive aspects furthermore relate to a reticle for use in lithographic processing of a device, the reticle comprising reticle features, wherein the reticle features are determined based on image performance effects due to system aberrations or image performance effects due to shadowing effects, as determined by a method for characterizing a lithographic process as described above.

Certain inventive aspects also relate to a lithographic processing system for lithographic processing of a device, the lithographic processing system being suitable for being operated with a reticle and the lithographic processing system being composed by components, wherein the components are determined taking into account image performance effects due to system aberrations or image performance effects due to shadowing effects, as determined by a method for characterizing a lithographic process as described above.

Certain inventive aspects also relate to a computing system, the system comprising a means for receiving values for a set of selectable process parameters determining a lithographic process, a means for receiving information about a reticle to be used in the lithographic process, a means for determining focus conditions allowing separation of an image performance of the lithographic processing due to system aberrations and an image performance of the lithographic processing due to reticle shadowing effects independently by combining information expressing a critical dimension or line width as a function of focus for at least two different angles of incidence of the illumination beam with respect to the reticle.

The system may furthermore comprise a means for evaluating at least one of the image performance due to system aberrations and the image performance due to reticle shadowing effects.

Certain inventive aspects also relate to a computer program product for executing a method for characterizing a lithographic process as described above and to a machine readable data storage device storing such a computer program product and to a transmission of such a computer program product over a local or wide area telecommunications network.

The teachings of the description permit the design of improved methods and apparatus for characterizing lithographic processing, for testing lithographic processing systems and for performing lithographic processing. The above and other characteristics, features and advantages of certain inventive aspects will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

FIG. 6b is a diagram of the effective shadowing angle as a function of the slit position as obtained for a reticle with test structures as described in FIG. 6a.

Figure 1A:
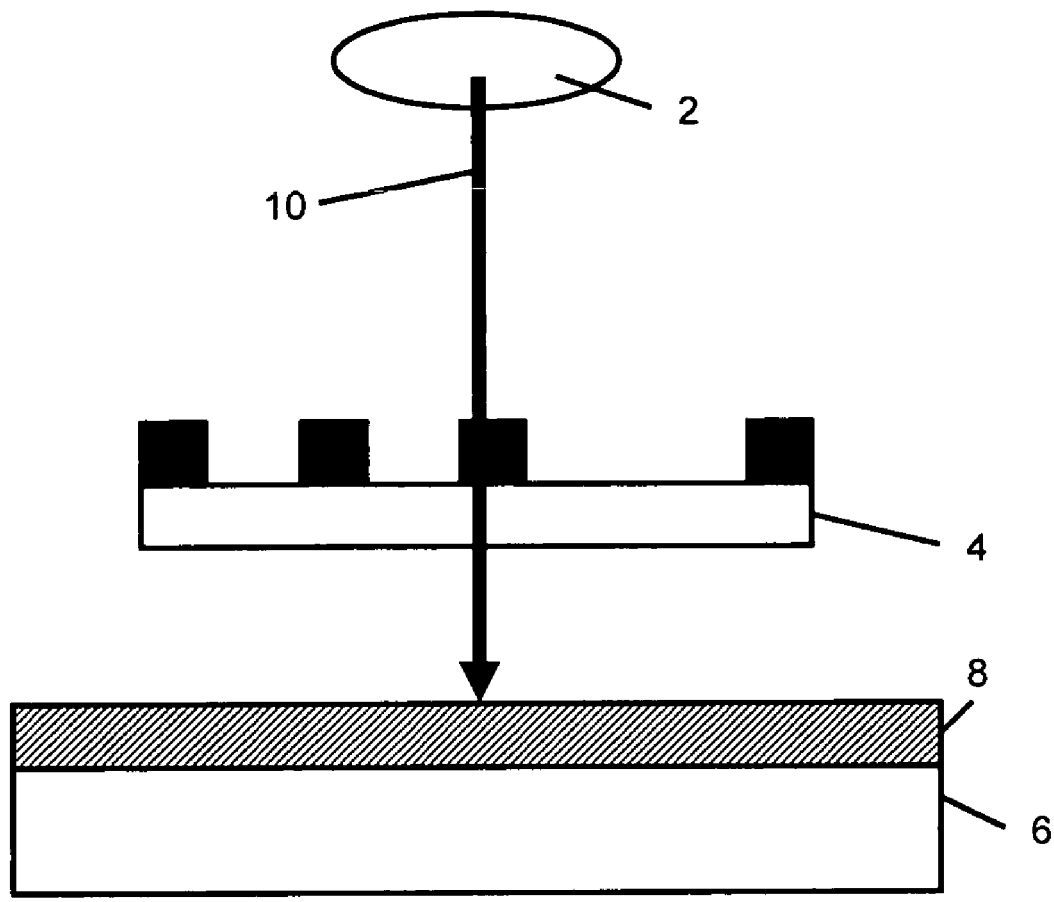
FIG. 1a is a schematic representation of the light path followed in a conventional lithographic process using a transmissive reticle.
Figure 1B:
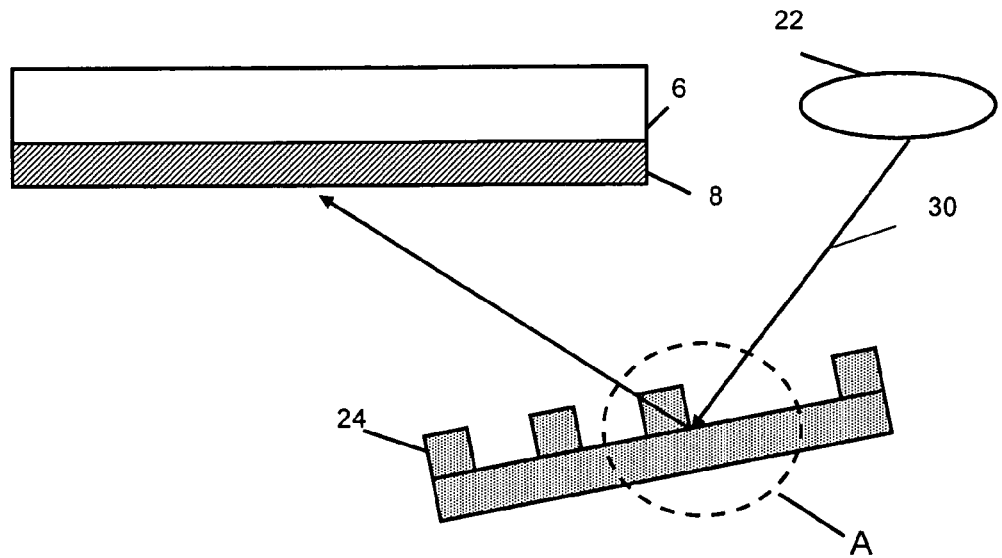
FIG. 1b is a schematic representation of the light path followed in a lithographic system operating with a reflective reticle, in extreme UV lithography applications.
Figure 1C:
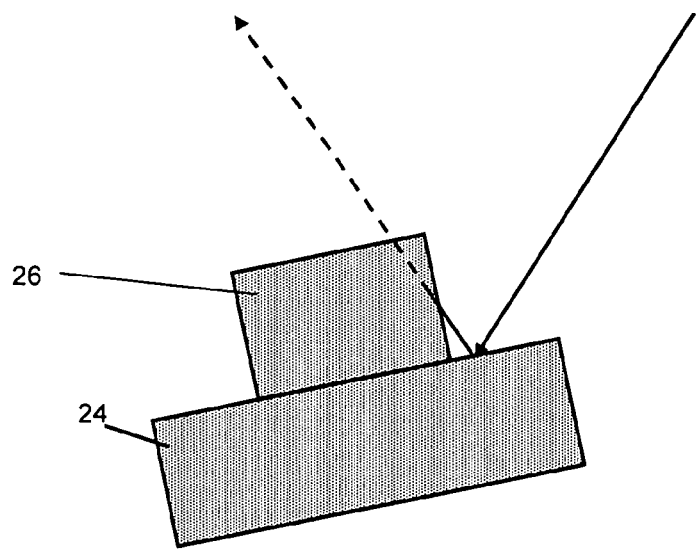
FIG. 1c is an enlarged fragmentary view A of FIG. 1b, showing more detail of the light reflection near the mask and illustrating the shadow effect as typically occurs in extreme UV lithography applications.

In the different figures, the same reference signs refer to the same or analogous elements.

DETAILED DESCRIPTION OF CERTAIN INVENTIVE EMBODIMENTS

The following terms are provided solely to aid in the understanding of the description. These definitions should not be construed to have a scope less than understood by a person of ordinary skill in the art.

A Bossung curve typically shows the critical dimension (CD) of a lined width as a function of the focus, i.e. the through focus behavior of the obtained critical dimension (CD) for a printed line or the aerial image of a printed line. The critical dimension thereby is defined as the smallest width of a line or the smallest space between two lines that can be allowed in the manufacturing of a device for a given lithographic process, as well known by a person skilled in the art.

With iso-sciatic, reference is made to a situation wherein for a given lithographic process an obtained printed line width or the aerial image thereof, obtained through experiments, based on calculation or using simulation, is substantially independent of the effective angle of incidence of an illumination beam with respect to the reticle, i.e. with respect to an average plane through the reticle. In other words, with iso-sciatic reference is made to the situation wherein an obtained printed line width is substantially independent of a shadowing effect. An iso-sciatic point, i.e. point of constant shadowing, thus indicates conditions which are substantially independent of the angle of incidence of the illumination beam on a reticle. With substantially independent of the angle of incidence there may be meant that the iso-sciatic conditions may vary within 5%, preferably within 2%, more preferably within 1% for an effective angle of incidence variation between 0° and the typical tool-dependent angle of incidence of the illumination beam with respect to the normal on the average plane through the reticle, such as e.g. between 0° and 6°, which is an often used angle of incidence for the illumination beam with respect to the reticle. The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present description, the only relevant components of the device are A and B.

Certain inventive aspects will now be described by a detailed description of several embodiments. It is clear that other embodiments can be configured according to the knowledge of persons skilled in the art without departing from the true spirit or technical teaching provided herein, the invention being limited only by the terms of the appended claims.

The embodiments are suitable for lithographic systems and methods using electromagnetic radiation with wavelengths having the same order of magnitude or being smaller than the reticle feature thickness. The latter typically includes extreme ultraviolet (EUV) radiation and X-ray radiation. For extreme ultraviolet radiation and X-ray radiation, a number of slightly different definitions are used in the field. Extreme ultraviolet radiation typically may include electromagnetic radiation in the wavelength range 31 nm to 1 nm and X-ray radiation typically may include electromagnetic radiation in the wavelength range 5 nm to 0.4 nm. It is to be noticed that the invention is not limited thereto and that slight variations in wavelength range may occur. Furthermore, for example lithography systems and methods using short wavelength radiation in the deep ultraviolet range, typically electromagnetic radiation in the wavelength range 250 nm to 7 nm, also may benefit from the present embodiment.

The embodiments typically may be related to a lithographic processing system. Some embodiments e.g. may relate to lithographic processing of a substrate as typically performed in a lithographic processing system. Some embodiments e.g. may relate to characterization and/or optimization of a lithographic process typically performed in a lithographic processing system or to characterization and/or optimization of a lithographic processing system itself. In the following an example lithographic processing system is described, methods and systems according to particular embodiments relating thereto or to any suitable lithographic processing system allowing lithographic processing whereby the wavelength of the illumination source used is of the order of magnitude or smaller than the thickness of reticle features in the reticle.

Figure 2:
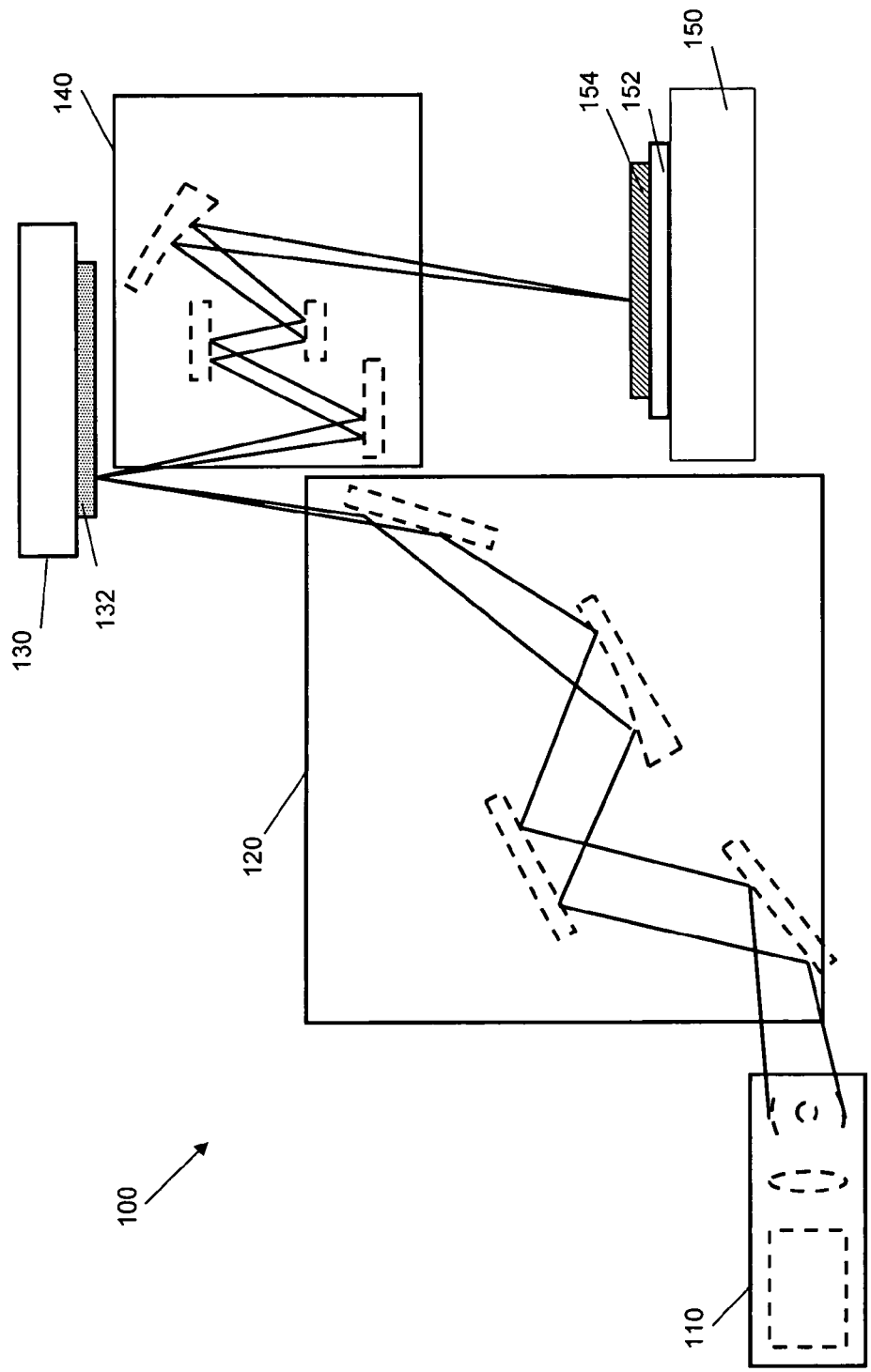
FIG. 2 shows a schematic view of an example lithographic processing system as can be used in methods according to certain embodiments.

FIG. 2 shows a schematic view of such an example lithography processing system. A reflective system such as often used in EUV lithography is shown by way of example. The system 100 comprises an illumination source 110, an illumination stage 120 for guiding the illumination beam from the illumination source 110 to a reticle stage 130, the reticle stage 130 being adapted for holding a reticle 132. The system 100 furthermore comprises a projection stage 140 for guiding the modulated illumination beam to the substrate stage 150 adapted for holding a device 152 typically comprising a resist layer 154. The illumination source 110 is adapted for providing electromagnetic radiation of a wavelength suitable for performing the lithographic processing, such as for example EUV light or X-ray radiation. The illumination stage may for example be a laser-fired plasma source, a discharge source, an undulator or wiggler in an electron beam storage ring or synchrotron, etc. The illumination stage 120 typically comprises one or more filters, mirrors, reflecting surfaces, adjusters, etc. in order to guide the illumination beam to the reticle stage 130. The illumination source 110 and illumination stage 120 typically are such that off-axes illumination of the reticle is obtained. Typically a lithographic system using short wavelengths according to some embodiments may operate in a reflective mode, i.e. wherein the optical elements typically are reflective elements rather than transmissive elements. The reticle stage 130 may be adapted for holding a reticle 132. Such a reticle is determined by a set of reticle parameters as described in more detail below. It typically comprises a reticle structure according to a reticle pattern used for modulating an illumination beam in order to generate a pattern in the resist layer 154 of the device 152. The projection stage 140 typically may comprise one or more filters, mirrors, reflecting surfaces, adjusters and possibly lenses. The components in the illumination stage 120 and the projection stage 140 may introduce typical aberrations in the optical systems, such as e.g. spherical aberrations, astigmatism, coma, etc. The reticle stage 130 and/or the substrate stage 150 may be adapted to provide movement to the reticle respectively the substrate. In some embodiments, a wafer stepper system as well as a step-and-scan system may be envisaged.

Figure 3:
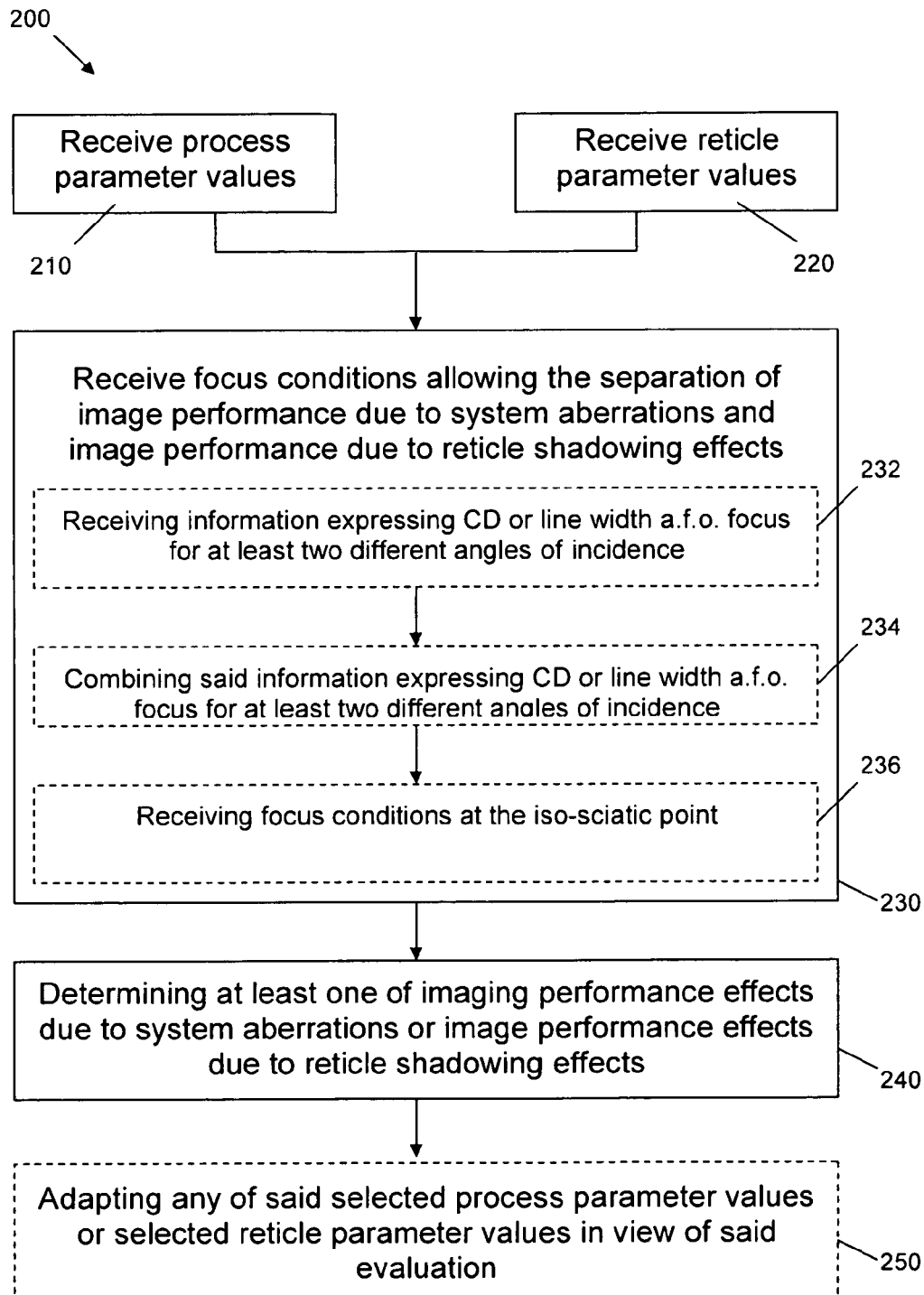
FIG. 3 is a flow diagram of a method for characterizing a lithographic process of a substrate according to a first embodiment.

A first embodiment relates to a method for characterizing lithographic processing of a device. The lithographic processing of a device typically is characterized, amongst others, by a set of focus conditions, a set of selectable lithographic processing system parameters and a set of reticle parameters. The method comprises receiving values for the lithographic processing system parameters and for the reticle parameters. It also comprises receiving for the lithographic processing characterized by the selected parameters, focus conditions allowing separation of image performance effects due to lithographic processing system aberrations and image performance effects due to reticle shadowing effects. It furthermore comprises determining at least one of the image performance effects due to lithographic processing system aberrations and the image performance effects due to reticle shadowing effects. The method may be performed in an automated way. By way of illustration, an example method 200 according to the present embodiment, comprising a number of processes, some of them being optional, is described in more detail below, in relation to FIG. 3.

In the present embodiment for characterizing lithographic processing of a device, a set of selectable lithographic processing parameter values are received in process 210 and a set of reticle parameters are received in process 220. Which of both processes is performed first is not limiting for the present embodiment.

By receiving the set of selectable lithographic processing system parameter values, the lithographic processing system 100 typically used for lithographic processing of a device 152 may be determined. The selectable lithographic processing system parameter values may be the type, position, orientation, composition and number of optical components in the illumination stage 120, the type and shape of the illumination source 110, the type, position, orientation, composition and number of optical components in the projection stage 140, and other system parameters such as the resist type used, the illumination conditions, such as exposure time, etc. The received parameters can be selected based on initial system parameters, based on variation of several parameters within predetermined ranges, based on the available system options or it can be a set of parameters corresponding with a lithographic system that is preferred to be used for the lithographic processing. In some embodiments, the optical components used in an illumination stage 120 and/or projection stage 140 of a lithography system 100 using short wavelength radiation such as e.g. EUV or X-rays, typically may be mirrors comprising a reflective layer, such as e.g. a multi-layer, although the invention is not limited thereto. An example of such a multi-layer may e.g. be a multi-layer consisting of about forty pairs of alternating molybdenum and silicon. The set of reticle parameters may comprise the type of reticle, composition of the reticle, the shape, position and dimensions of reticle features, the use of OPC features, etc. The set of reticle parameters thus also may comprise parameters describing a pattern present in the reticle 132, thus including a pitch, a line/spacing (L/S) value. The pattern used e.g. may be a pattern especially suited for studying image performance or may be a pattern for a print to be made in the device 152. The lithography reticle 132 that is typically used in embodiments of the present application is a reflective reticle. An example of a reticle 132 that can be used in methods and systems according to some embodiments may comprise a low thermal expansion substrate covered with a multi-layer, for example comprising about forty pairs of alternating molybdenum and silicon, a buffer layer, such as e.g. SiO2 and finally an absorber layer, such as e.g. TaN, at the top of the stack. The thickness of the buffer and absorber thickness may typically be in the ranges 10 nm-50 nm and 50 nm-100 nm, respectively. The absorber thickness is determined by the absorption capabilities of the material. In conclusion, in process 210 and 220, the parameters of the lithographic process under study, determined by lithography processing system parameters and reticle parameters are determined thus characterizing the lithographic processing. The optical properties of the system 100 as well as of the reticle 132 used, determines the specific imaging characteristics of the system, such as e.g. system aberrations. It may be a specific purpose of the method according to the present embodiment to study lithographic processing system aberrations for a system and/or to optimize lithographic processing system aberrations.

Figure 4A:
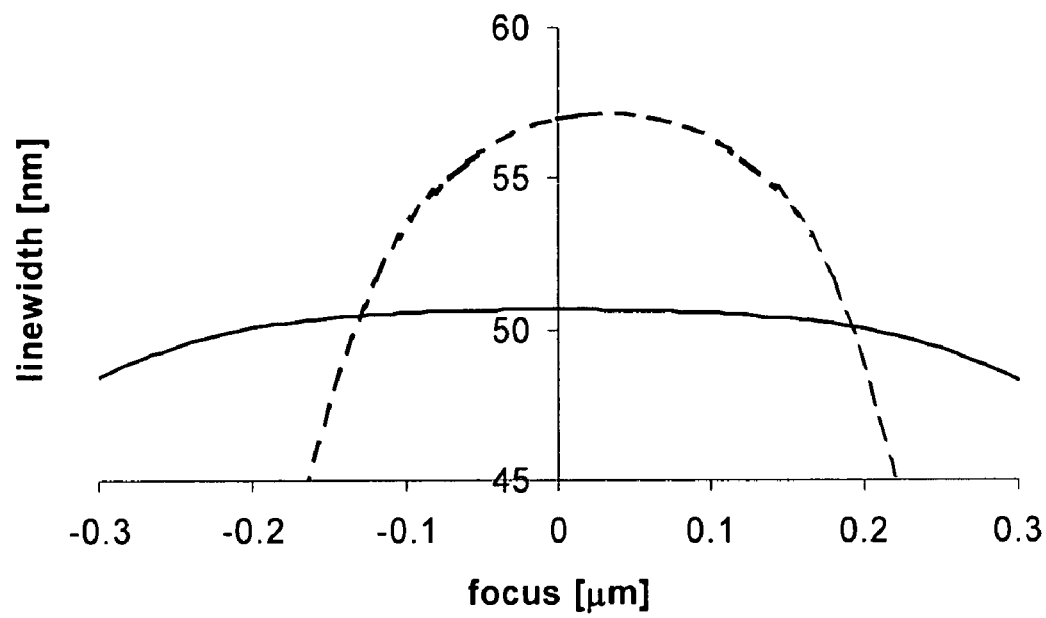
FIG. 4a illustrates Bossung curves for 50 nm dense lines using a Kirchoff approximation and using an electromagnetic field approximation, indicating the shadowing effect as taken into account in certain embodiments.
Figure 4B:
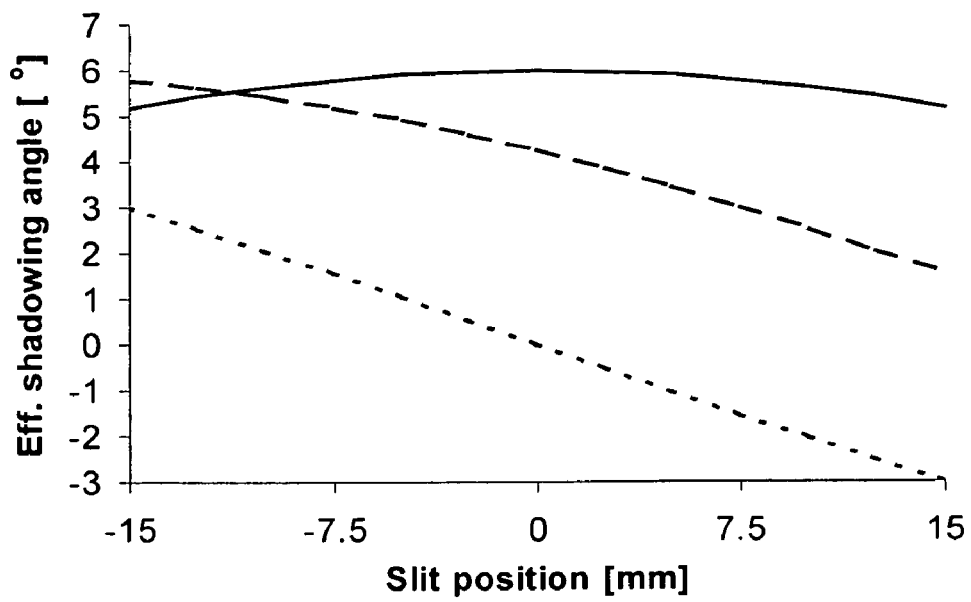
FIG. 4b illustrates the shadowing effect for different line orientations (0°: full line; 45°: dashed line; 90°: dotted line) for a lithography system with an illumination having an angle of incidence on the reticle of 6°, indicating the shadowing effect as taken into account in certain embodiments.

The method furthermore comprises in process 230 receiving focus conditions allowing the separation of image performance effects due to system aberrations, such as e.g. spherical aberrations, coma, astigmatism, etc., and image performance effects due to reticle shadowing effects. The latter typically are related to the thickness of the reticle, compared to the wavelength of the radiation used for lithographic processing. Receiving such focus conditions may be performed e.g. by simulation of a lithographic process according to the selected process and reticle parameters and receiving focus conditions based thereon. Such simulations can be e.g. done using any suitable simulation software, such as Prolith 9.0 AMP as obtainable from KLA-Tencor, EM-Suite as obtainable from Panoramic Technology or Solid-EUV 2.1 as obtainable from Sigma-C. Typically the simulation software used to obtain results preferably take into account the topography of the lithographic reticle 132 used. The need for such an approach taking into account the topography of the lithographic reticle 132 is illustrated in FIG. 4a, where a comparison is shown for simulated Bossung curves based on a Kirchoff approximation, indicated by the full line, and on a rigorous electromagnetic field (EMF) approximation, indicated by the dashed line. In the Kirchoff approximation for the modelling of the reticle/light interaction the intensity and phase is modulated using the 2D design, i.e. the intensity is one in reflective regions and zero in absorbing regions. In rigorous electromagnetic field simulations, the full information regarding topography and optical material properties of the reticle are taken into consideration, i.e. the modulation is based on a 3D design of the reticle. The example simulations shown in FIG. 4a for an effective shadowing angle of 0° for 50 nm dense line/spacing, use simulation settings of NA=0.25, conventional illumination with coherence of 0.25 and an aerial image threshold of 0.22. The Kirchoff approach results in a symmetrical Bossung curve, while the EMF simulation, which better images the real situation, shows an asymmetrical behavior, which originates from the complex phase behavior. The line width offset between both simulations is also related to the mask topography and can be removed by adapting the exposure dose. In FIG. 4b, the effective shadowing angle for a horizontal line at 0° indicated by the solid line, a vertical line at 90° indicated by the dotted line and a 45°-tilted line, indicated by the dashed line is shown for different slit positions for a lithographic system having an angle of incidence with respect to the reticle plane of 6°. The latter illustrates that different shadowing effects occur. Both FIG. 4a and FIG. 4b illustrate that simulation which takes into account the topography of a mask preferably is used to include the optical effects present in a lithographic system. Alternatively, although less probable due to higher costs, receiving focus conditions allowing the separation of image performance effects due to system aberrations and image performance effects due to reticle shadowing effects, as described in process 230, also may be performed experimentally. Receiving focus conditions also may comprise receiving focus conditions from an external source, such as e.g. a book or a database.

Receiving such focus conditions may comprise determining an iso-sciatic point, i.e. a point where the obtained results are independent of the angle of incidence on the reticle 132. The latter may be performed in automated way. At such focus conditions, there is a fixed influence of the shadowing effect. Such conditions may be obtained by determining information expressing the critical dimension or line width as a function of the focus for at least two different effective shadowing angles. The latter is indicated by optional process 232, being a possible specification of part of process 230. Information expressing the critical dimension or line width as a function of the focus for at least two different effective shadowing angles may be provided in a Bossung curve, which is a plot of the line width or critical dimension as a function of the focus. The effective shadowing angle is determined by the orientation of the line on the reticle, by the slit position and by the angle of incidence of the illumination beam with respect to the reticle, as illustrated in FIG. 4b. Determining information expressing the critical dimension or line width as a function of the focus for at least two different effective shadowing angles may be done using the above described simulation software. In a further optional process 234, being a possible specification of part of process 230, the information expressing the critical dimension or line width as a function of the focus for at least two different effective shadowing angles is combined. From that combined information, an iso-sciatic point may be determined, in optional process 236, being a possible specification of part of process 230.

Figure 5:
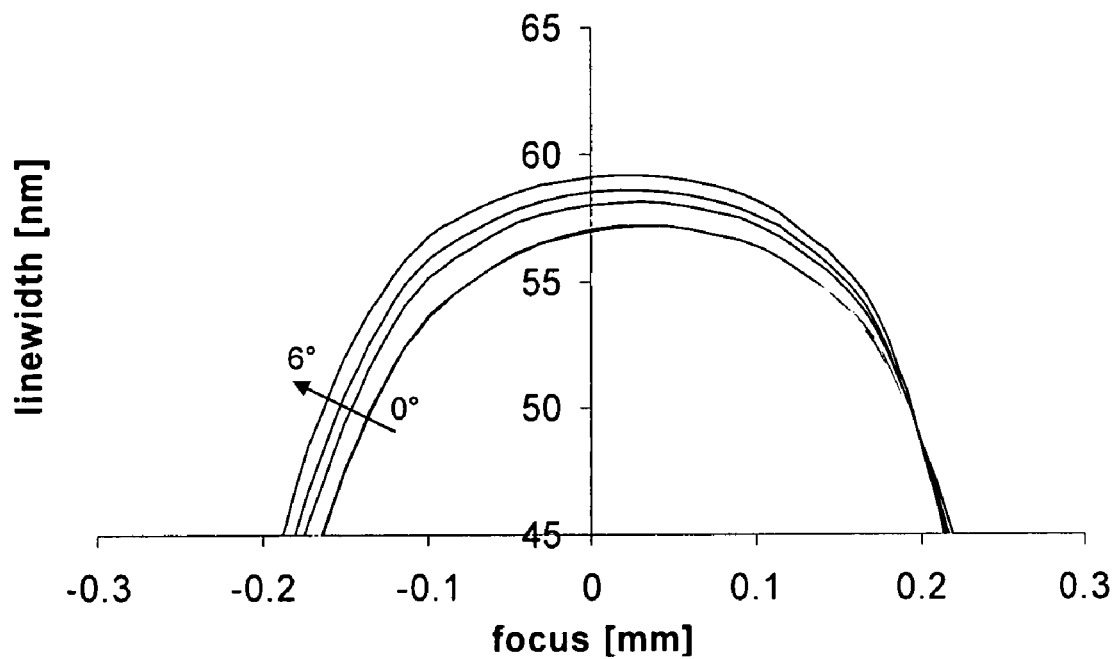
FIG. 5 illustrates a set of Bossung curves for different effective shadowing angles crossing at the iso-sciatic point according to a principle as may be used in certain embodiments.

In FIG. 5, an example of a number of Bossung curves of the aerial image for 50 nm L/S lines is shown for different effective shadowing angles between 0° and 6° with a step of 1°. It indeed can be seen that the Bossung curves cross at a particular point independent of the effective shadowing angle used, i.e. the iso-sciatic point.

Returning to FIG. 3, in process 240, at least one of the image performance effects due to lithographic system aberrations or the image performance effects due to the reticle shadowing effect are determined. The latter is performed using the received focus conditions and may be performed in order to reduce the influence by system aberrations or reticle shadowing effects. The latter may be performed in automated way. The determination may e.g. comprise determining image performance effects due to lithographic system aberrations, such as e.g. coma, spherical aberration or astigmatism. Such determination may be based on the above received information expressing the critical dimension or line width as a function of the focus. It also may be done by simulating the lithographic process using the selected parameters and the received focus conditions, as the latter provides information that is substantially independent of the angle of incidence of the illumination beam with respect to the reticle 132. In other words, using the received conditions, a fixed shadow effect is obtained, allowing a study of the lithographic system aberrations. Determining image performance effects also may comprise determining image performance effects due to reticle shadowing effects. The latter may, by way of example, be performed by first characterizing the image performance effects due to lithographic system aberrations and then study the reticle shadow effect taking into account the determined image performance effects due to lithographic system aberrations. Determining image performance effects also may comprise evaluating the image performance effects or the image performance of the system influenced by the image performance effects on whether a sufficient print can be obtained in the lithographic process of the device. The latter may be based on the obtained processing window, i.e. exposure/focus window, for the lithographic process. Such evaluating may result in receiving other values for part or all of the lithographic processing parameters and/or reticle parameters or may result in outputting the values of the parameters and/or comparing lithographic processing using the received set of parameters with previously determined results. Evaluating thus also may optionally comprise altering lithographic processing system parameter values or reticle parameter values in order to improve the image performance, as shown in optional process 250. Evaluating the image performance effects also may comprise evaluating the image performance effects due to system aberrations and/or reticle shadowing effects and determining whether the system aberrations and/or shadowing effects are within predetermined specifications. Such predetermined specifications may comprise maximal system aberrations allowed for a lithographic processing system.

The different processes in the above described method may be repeated until a suitable or allowable set of process parameter values is determined, i.e. for example until a set resulting in smaller, preferably minimal, system aberrations or smaller, preferably minimal, reticle shadowing effects are obtained. It may be tried to minimise the effects below a predetermined level. The method may be performed in an automated way, e.g. based on specific computer implemented algorithms, neural networks, etc.

A second embodiment relates to a method for lithographic processing of a device using a reticle. The method for lithographic processing comprises an illumination process and typical other lithographic processing steps as well known by a person skilled in the art. In the present embodiment the illumination process is adapted taking into account image performance effects due to system aberrations, independent of variations due to reticle shadowing effects, or taking into account image performance effects due to reticle shadowing effects, independent of variations due to system aberrations. The latter may be performed by determining specific illumination conditions resulting in small or no image performance effects due to system aberrations as determined with a method according to the first embodiment. The latter also may be performed by obtaining specific illumination conditions resulting in small or no image performance effects due to reticle shadowing effects as determined with a method according to the first embodiment. Alternatively or in combination thereto, the illumination process also may be adapted by selecting a reticle 132 comprising reticle features determined based on image performance effects due to system aberrations, independent of variations due to a reticle shadow effect, or based on image performance effects due to shadowing effects, independent of variations due to system aberrations as determined with a method according to the first embodiment. The method for lithographic processing of a device may lead to improved lithographic processing, resulting in a higher quality of the obtained printed image. The method may be performed in an automated way.

A third embodiment relates to a lithographic processing device such as a lithographic processing system 100 or a reticle 132 or the combination thereof comprising features determined based on image performance effects due to system aberrations or image performance effects due to shadowing effects, as determined by a method for characterizing a corresponding lithographic process according to the first embodiment. The present embodiment e.g. relates to a reticle comprising reticle features that are determined based on image performance effects due to system aberrations or image performance effects due to shadowing effects. Such reticle features may comprise composition/construction of the reticle, the shape, position and dimensions of reticle features, the use of OPC features, etc. The composition of the reticle may e.g. be altered by adjusting a reflective coating used on the reticle for creating a reflective region or by adjusting a buffer or absorption layer used on the reticle. The construction of the reticle may e.g. be altered by adjusting the position on the reticle where reflective coating material, buffer layer material or absorber material will be present. Altering the shape, position and dimensions of reticle features or using OPC features may be performed to correct for system aberrations or reticle shadowing effects, the effects thereof being determined using a method according to the first embodiment. Altering these reticle features may be performed during creation of the reticle design, which may e.g. be performed using software means such as E(electronic) D(esign) A(utomation) tools provided by companies such as Cadence or Numerical Graphics, both US-based companies or by ASM-L Masktools, a Netherlands-based company. Starting from a given design, an new design for an adapted reticle typically can be generated by manipulating pattern info of this given design, e.g. varying the dimensions, deleting or adding features, etc.

The present embodiment e.g. also relates to a lithographic system comprising system components that are determined based on image performance effects due to system aberrations or image performance effects due to shadowing effects. An example of a lithographic system can be seen in FIG. 2, the embodiment not being limited thereto. In the present embodiment, the system components may be adapted by selecting a specific type, position, orientation, composition and/or number of optical components in the illumination stage 120, selecting a specific type and/or shape of the illumination source 110, or by selecting a specific the type, position, orientation, composition and number of optical components in the projection stage 140.

Improved reticles, lithographic processing systems or combinations thereof can be obtained, suffering e.g. less from reticle shadow effects and/or less from system aberration effects.

A fourth embodiment relates to a reticle that can be used in a method for characterizing a lithographic process or in a method for studying a lithographic process according to any of the previous embodiments. The reticle comprises a test structure whereby the test structure comprises at least one pattern allowing evaluation of image performance due to reticle shadowing effects and/or image performance due to lithographic processing system aberrations. In a preferred embodiment, the test structure comprises a test pattern that is repeated substantially across the mask to resolve aberration effects in the whole imaging field. In FIG. 6 an example test pattern 270 is shown by way of illustration. The example test pattern 270 may e.g. be repeated in a grid of test patterns 270. For the test reticle shown in FIG. 6, the grid is a 7 by 6 grid.

Figure 6A:
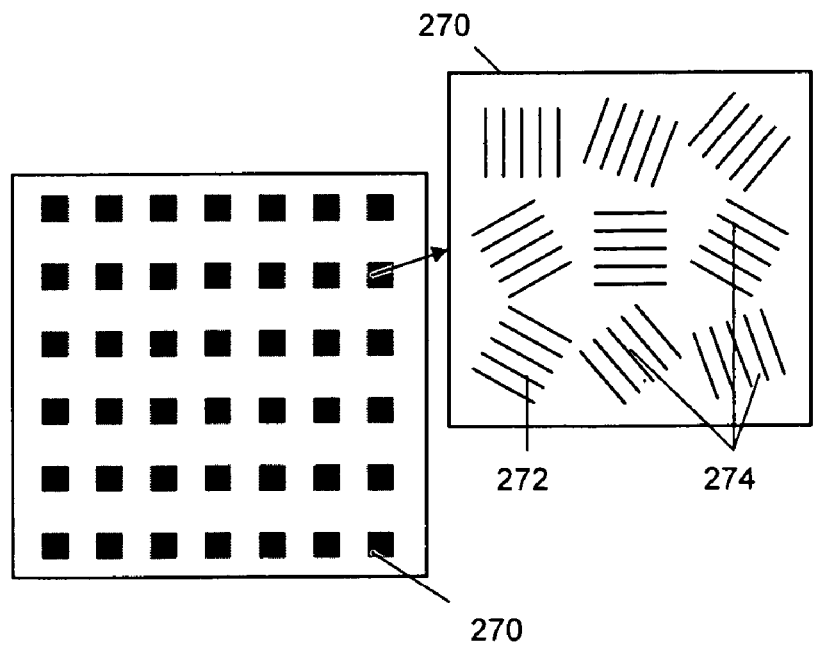
FIG. 6a is a schematic representation of a reticle with test structure for characterizing lithographic processing, as can be used in certain embodiments.
Figure 6B:
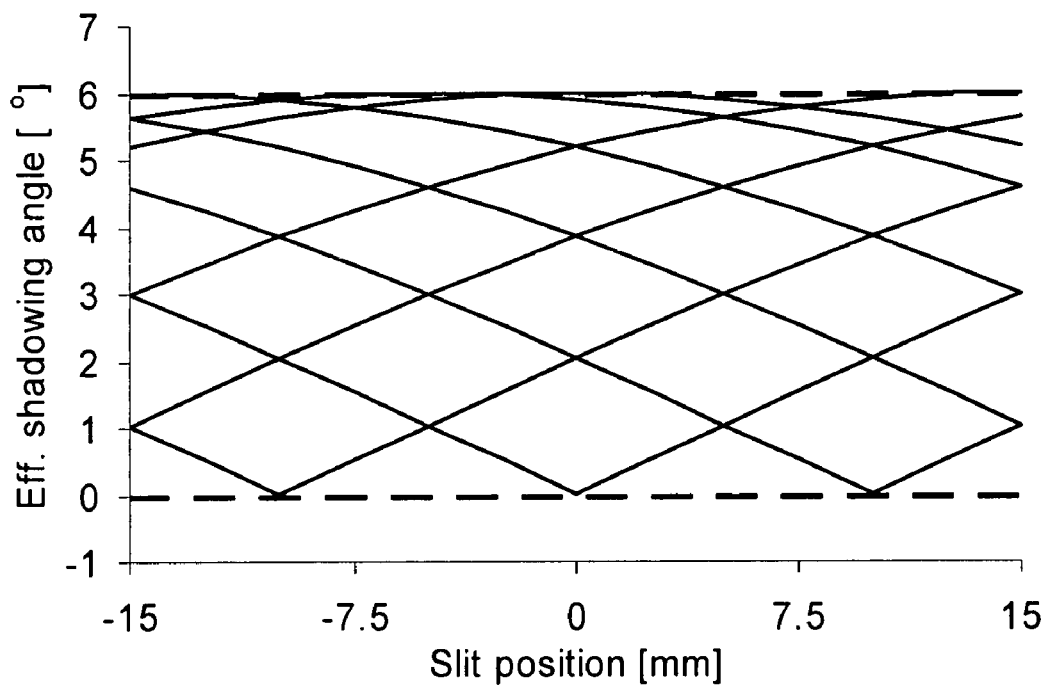

The at least one pattern allowing evaluation of image performance due to reticle shadowing effects and/or image performance due to lithographic processing system aberrations may comprise L/S gratings that are rotated, with respect to each other. The latter is also illustrated in FIG. 6a, showing an enlarged view of a test pattern with first parallel lines 272 having e.g. a first direction and at least one set of parallel lines that are rotated over angle with respect to the first parallel lines 272, e.g. a plurality of sets of parallel lines 274 rotated over 160° in steps of 20°, e.g. from −90° to 70° in steps of 20° with respect to a horizontal direction. Such sets of parallel lines may be e.g. of size 50×50 □m2 for scatterometry purposes. It also may be e.g. smaller patterns such as a fixed number of 10 □m long lines for CD-SEM measurements. In FIG. 6b, the obtained effective shadowing angles are shown as obtained using the grating orientations of the test reticle described in FIG. 6a, showing that using different orientations for the test gratings allows to substantially cover the complete region at each slit position, for a given lithographic tool. It will be clear that the different orientations of the gratings shown for the example of FIG. 6a are only an illustration and are not limiting for the embodiment. Preferably the grating orientations are such that representative points in the relevant effective shadowing angle range for the lithographic system under study are probed, e.g. a number of points substantially spread over the complete range.

In the present embodiment, the patterns typically are provided such that a reflective reticle is created. Such a reticle may be made using standard reticle processing techniques as well known by a person skilled in the art. By way of example, such patterns may be made by providing a low thermal expansion substrate covered with a multi-layer, for example comprising about forty pairs of alternating molybdenum and silicon. Such a multi-layer may operate as reflective part of the reticle. In parts where the reticle needs to be non-reflective, a buffer layer, such as e.g. SiO2 and finally an absorber layer, such as e.g. TaN, may be provided in the stack. The thickness of the buffer and absorber thickness may typically be in the ranges 10 nm-50 nm and 50 nm-100 nm, respectively, although the embodiment is not limited thereto. The absorber thickness is determined by the absorption capabilities of the material.

The reticle furthermore may comprise a pattern to be imaged on a device during lithographic processing of the device, e.g. a device-specific pattern used in the manufacturing of the device. The latter may e.g. comprise a pattern used in a manufacturing process for a die. In this way, the reticle can be used both for standard processing and for characterizing according to the above described method. It may be advantageous that results may be obtained simultaneously.

Figure 7:
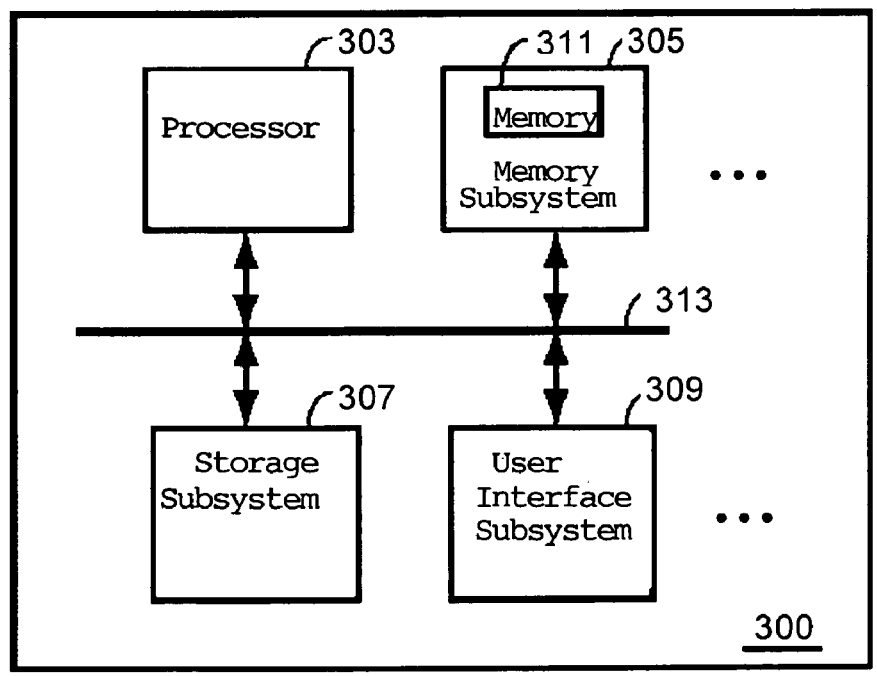
FIG. 7 is a schematic representation of a processing system that may be adapted for performing any of or part of the method embodiments.

A fifth embodiment relates to a processing system wherein the method embodiments are implemented. In other words, it relates to a processing system adapted for performing a method 200 for characterizing lithographic processing of a device according to one embodiment, comprising selecting values for the lithographic processing system parameters and for the reticle parameters, obtaining focus conditions allowing separation of image performance effects due to lithographic processing system aberrations and image performance effects due to reticle shadowing effects. The processing system also is adapted for determining image performance effects due to lithographic processing system aberrations, independent of variations due to reticle shadowing effects, and/or image performance effects due to reticle shadowing effects, independent of variations due to system aberrations. An exemplary processing system 300 is shown in FIG. 7. FIG. 7 shows one configuration of processing system 300 that includes at least one programmable processor 303 coupled to a memory subsystem 305 that includes at least one form of memory, e.g., RAM, ROM, and so forth. A storage subsystem 307 may be included that has at least one disk drive and/or CD-ROM drive and/or DVD drive. In some implementations, a display system, a keyboard, and a pointing device may be included as part of a user interface subsystem 309 to provide for a user to manually input information. Ports for inputting and outputting data also may be included. More elements such as network connections, interfaces to various devices, and so forth, may be included, but are not illustrated in FIG. 7. The various elements of the processing system 300 may be coupled in various ways, including via a bus subsystem 313 shown in FIG. 7 for simplicity as a single bus, but will be understood to those in the art to include a system of at least one bus. The memory of the memory subsystem 305 may at some time hold part or all (in either case shown as 311) of a set of instructions that when executed on the processing system 300 implement the process(s) of the method embodiments described herein.

It is to be noted that the processor 303 or processors may be a general purpose, or a special purpose processor, and may be for inclusion in a device, e.g., a chip that has other components that perform other functions. Thus, one or more inventive aspects can be implemented in digital electronic circuitry, or in computer hardware, firmware, software, or in combinations of them. Furthermore, inventive aspects can be implemented in a computer program product tangibly embodied in a carrier medium carrying machine-readable code for execution by a programmable processor. Embodiments of a method may be performed by a programmable processor executing instructions to perform functions of those inventive aspects, e.g., by operating on input data and generating output data. Accordingly, one embodiment includes a computer program product which provides the functionality of any of the methods described above when executed on a computing device. Further, one embodiment includes a data carrier such as for example a DVD, CD-ROM or a diskette which stores the computer product in a machine-readable form and which executes at least one of the methods described above when executed on a computing device. Nowadays, such software is often offered on the Internet or a company Intranet for download, hence one embodiment includes transmitting the computer product described above over a local or wide area network.

The advantages of the methods and systems according to certain embodiments will be further illustrated by way of examples. Experiments were performed for studying spherical aberration, coma aberration and astigmatism. The adjusted method for studying or characterizing lithographic processing is illustrated by the provided examples of several dedicated experiments. By way of example, results for two series of examples are provided, the first one reporting on degradation and shift of the iso-sciatic point for spherical aberration and the second one reporting on degradation and shift of the iso-sciatic point for coma.

Figure 8A:
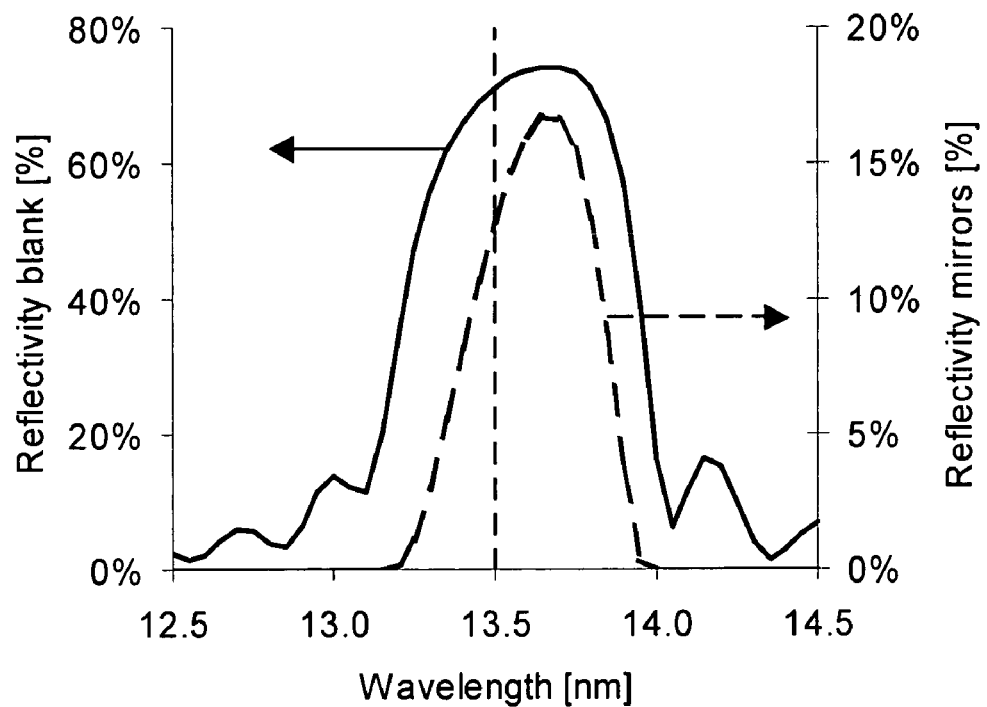
FIG. 8a and FIG. 8b show the reflectivity of a multi-layer (FIG. 8a) and a multi-layer covered with a buffer layer and absorber (FIG. 8b) used in a lithography system and reticle, as may be used in certain embodiments.
Figure 8B:
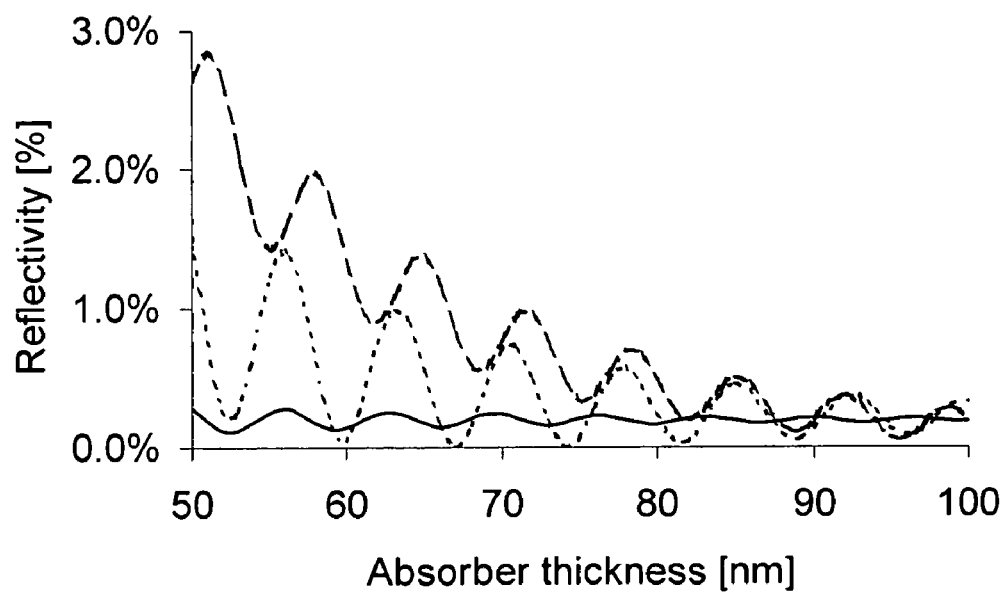
Figure 9:
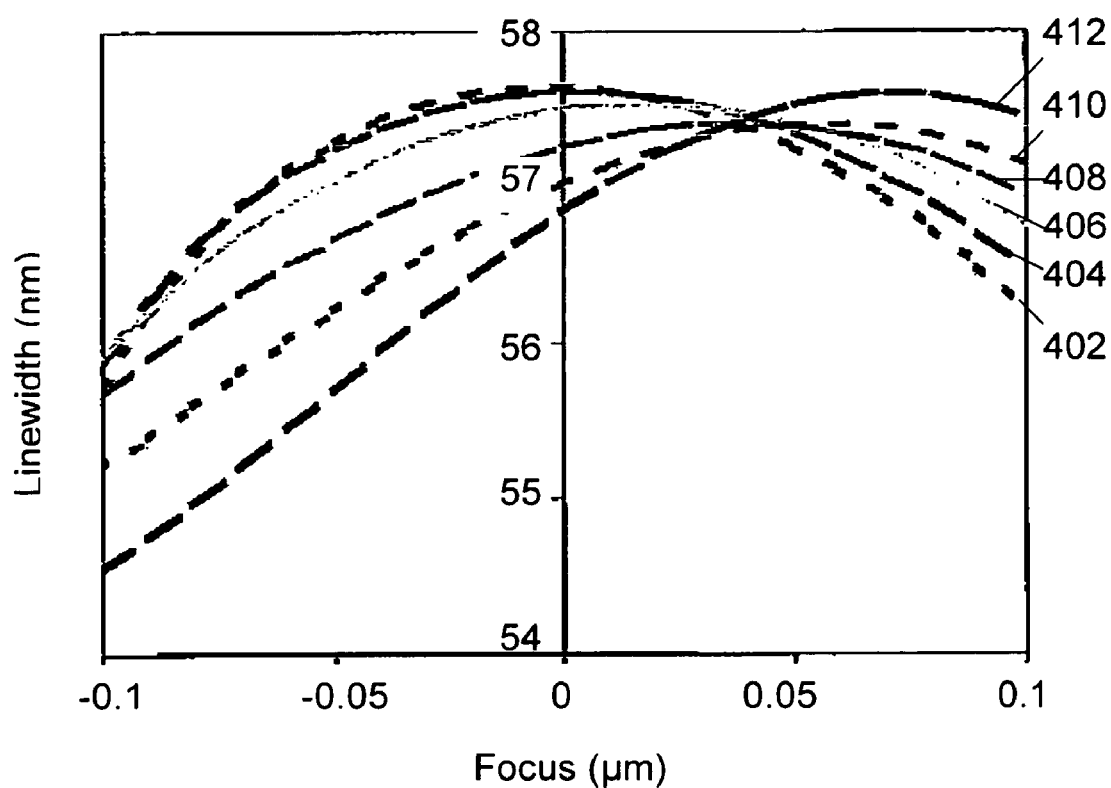
FIG. 9 is an example of a set Bossung curves for different angles of incidence crossing at the iso-sciatic point according to a principle as used in certain embodiments.

The results shown are based on a reflective mask comprising forty pairs of alternating molybdenum and silicon, a buffer layer of SiO2 and finally an absorber layer TaN, at the top of the stack. The thickness of the buffer and absorber thickness may typically 25 nm and 80 nm respectively. A molybdenum layer typically was 2.8 nm, whereas a silicon layer typically was 4.2 nm. The absorber thickness is determined by the absorption capabilities of the material. The reflectivity properties of the mask and the mirrors used are shown by way of example in FIG. 8a and FIG. 8b. FIG. 8a shows the EUV reflection for a bare multi-layer, indicated by a solid line. It can be seen that the EUV light is only reflected in a small bandwidth. The dashed line in FIG. 8a indicates the reflectivity for EUV light that is reflected by 6 mirrors comprising a multi-layer as described above. It can be seen that a reduced bandwidth is obtained. FIG. 8b shows the effect on reflectivity of adding a buffer layer and absorber on top of the multi-layer. This strongly reduces the reflectivity. Results are shown for the SiO2 buffer layer and the TaN absorber as described above using a coherent 13.5 nm wavelength radiation, as indicated by the dotted line, for a similar system using radiation having the reduced bandwidth as shown in FIG. 8a, as indicated by the full line, and for a system wherein germanium is used as absorber using coherent 13.5 nm wavelength radiation as indicated by the dashed line. The above indicates that the imaging performance depends on the mask materials.

In the present examples, the results shown are based on simulations of a lithographic system having a numerical aperture NA=0.25, a conventional light source with a coherence of 0.5 and a reticle pattern with a 50 nm dense L/S line pattern. Bossung curve simulations using the Prolith 9.0 AMP, as obtainable from KLA-Tencor and Solid-EUV, as obtainable from sigma-C, with varying angles of incidence are shown. Both lithography simulation packets show the same results. The angle of incidence is in the present example varied between 0 and 7.2 degrees in steps of about 1.4 degree. Curves 402, 404, 406, 408, 410, 412 show the Bossung curve for an angle of incidence of 0°, 1.4°, 2.9°, 4.3°, 5.7°, 7.2° respectively. It can be seen that at discrete defocus off-sets, the printed line width is independent of the incident angle. In other words, at discrete defocus off-sets, the printed line width is independent of the shadowing effect. Such point(s) is called the iso-sciatic point, also referred to as the point of constant shadowing. For an ideal optical system this means that the size of a printed feature with a given mask-CD and orientation does not change through slit.

Figure 10A:
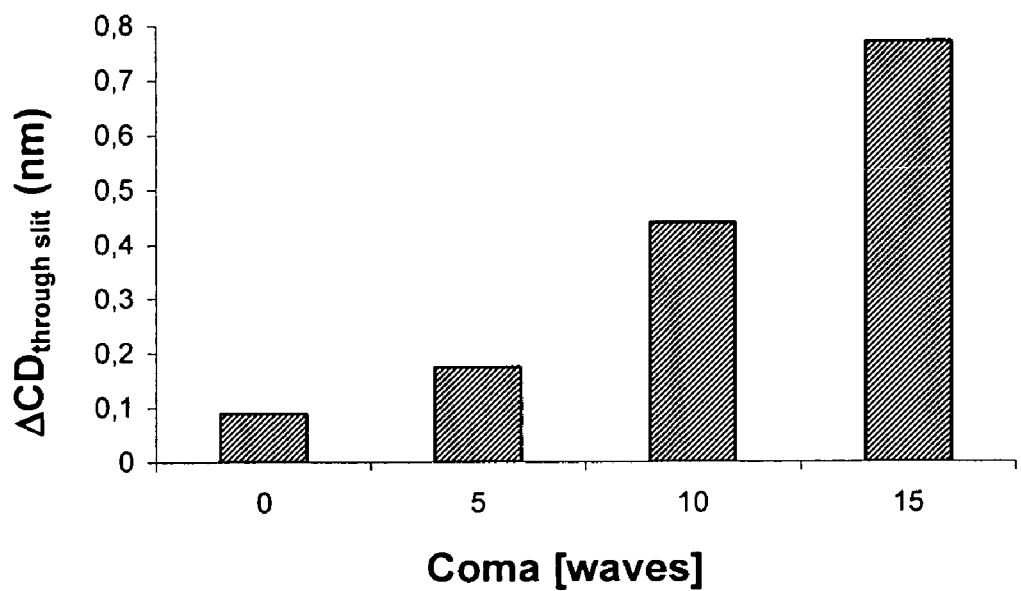
FIG. 10a and FIG. 10b show the variation in critical dimension (FIG. 10a) and the variation in position of the iso-sciatic point (FIG. 10b) for coma aberration, in accordance with certain embodiments.
Figure 10B:
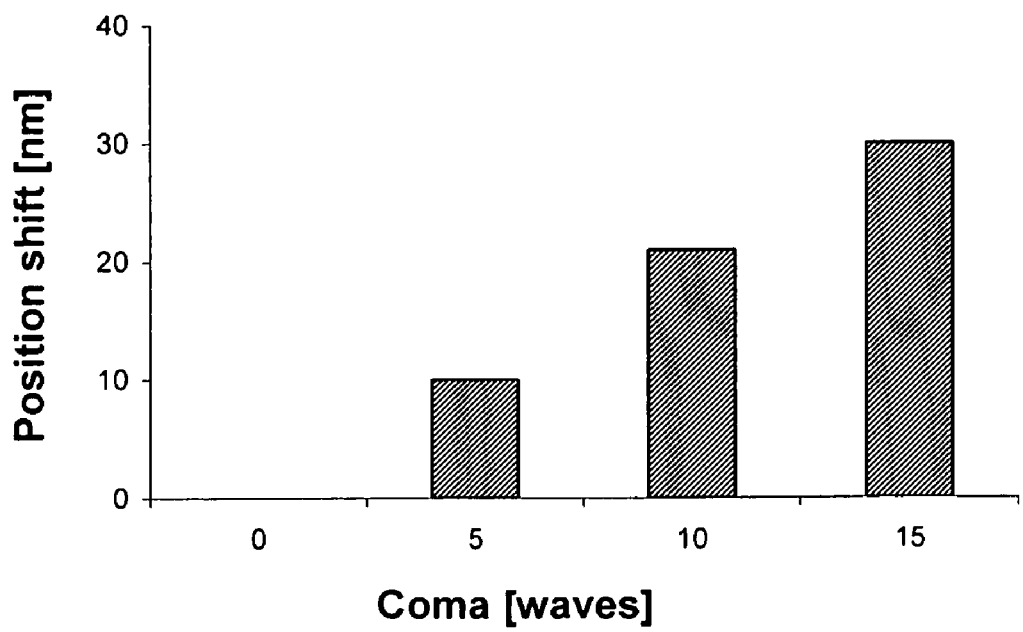
Figure 11A:
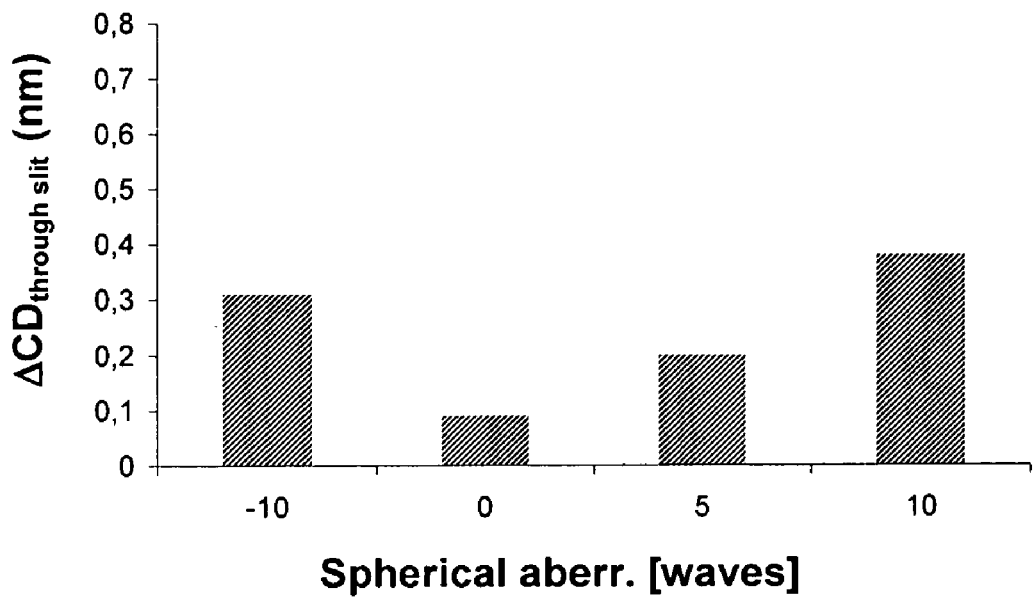
FIG. 11a and FIG. 11b show the variation in critical dimension (FIG. 11a) and the variation in position of the iso-sciatic point (FIG. 11b) for spherical aberration, in accordance with certain embodiments.
Figure 11B:
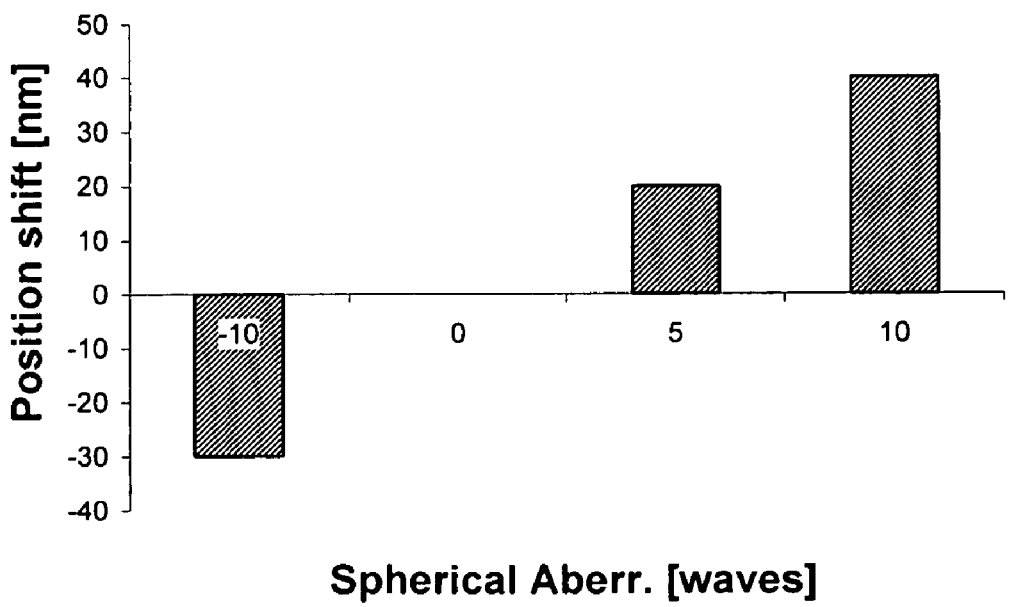
Figure 12A:
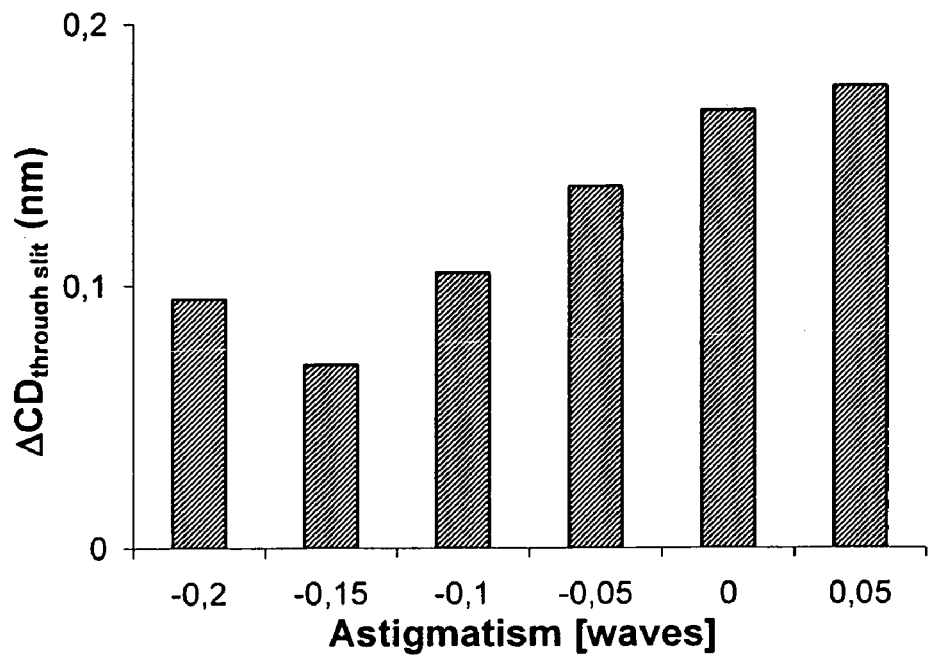
FIG. 12a and FIG. 12b show the variation in critical dimension (FIG. 12a) and the variation in position of the iso-sciatic point (FIG. 12b) for astigmatism aberration, in accordance with embodiments.
Figure 12B:
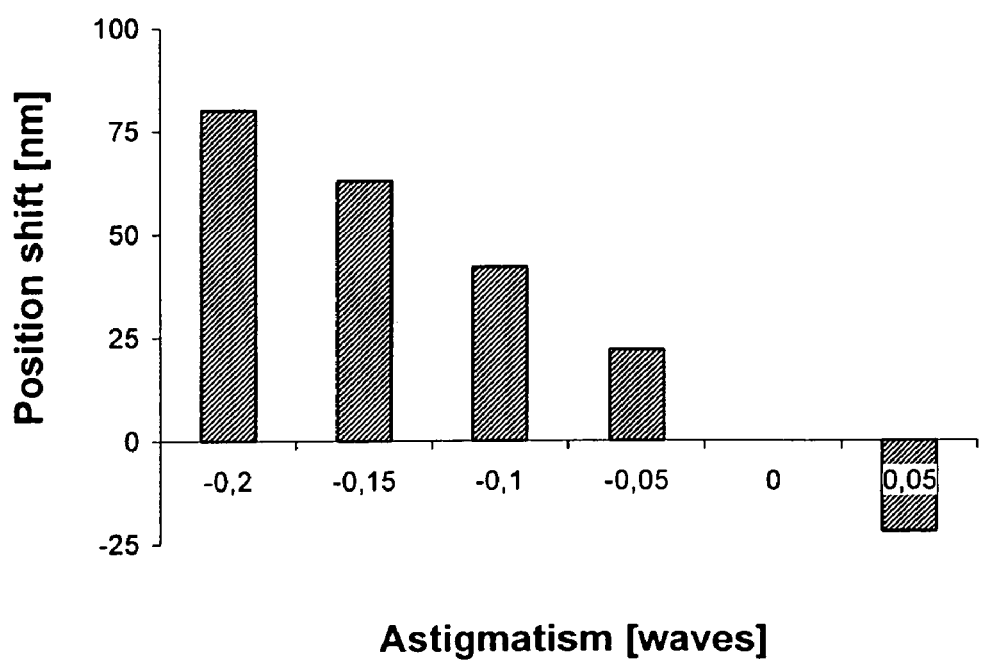

With a suitable test structure it is possible to use this effect to distinguish between image performance due to mask topography and due to illumination effects from aberrations through slit. The approach was tested for the following aberrations: coma, spherical and astigmatism. It was seen that the focus position of the iso-sciatic point and the critical dimension (CD) spread, defined as ΔCDmax. ΔCDmin, are affected by aberrations. In the present example, the focus position shift and the CD spread are used as metric. FIG. 10*a* and FIG. 10*b* show the focus position shift and the CD spread for coma aberration. FIG. 11*a* and FIG. 11*b* show the focus position shift respectively the CD spread for spherical aberration. FIG. 12*a* and FIG. 12*b* show the focus position shift respectively the CD spread for astigmatism. The aberration coefficients are expressed in units of waves, being the optical path difference divided by the wavelength. It can be seen that when there is no coma or spherical aberration, the iso-sciatic CD spread is of the minimal size. Increasing the aberrations shows an increase in the spread, i.e. a linear increase for coma and a quadratically increase for spherical aberrations, and a linear shift of the iso-sciatic focus point. The focus position shift is much larger, i.e. in the range of tens of nanometers, than the increase in the dimensions of the CD spread area, being smaller than 1 nm. It can also be seen that a certain amount of astigmatism can result in a slightly smaller iso-sciatic area.

From the above it can be seen that experimentally, it may be difficult to determine an increase in size of the CD spread for the iso-sciatic area due to a limitation of the currently available metrology tools, such as CD-SEM or scatterometry. Therefore, typically, shift of the iso-sciatic point may be used to determine the aberration effects.

Although systems and methods as disclosed are embodied in the form of various discrete functional blocks, they could equally well be embodied in an arrangement in which the functions of any one or more of those blocks or indeed, all of the functions thereof, are realized, for example, by one or more appropriately programmed processors or devices While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A method of lithographic processing with a lithographic processing system and a reticle, the method comprising:
   receiving values for the lithographic processing system parameters and for the reticle parameters,
   receiving focus conditions for the lithographic processing, the focus conditions comprising information expressing a critical dimension or line width as a function of focus for at least two different angles of incidence of the illumination beam with respect to the reticle and allowing separation of image performance effects due to lithographic processing system aberrations and image performance effects due to reticle shadowing effects, and
   determining image performance effects due to lithographic processing system aberrations and the image performance due to reticle shadowing effects separately by combining the information expressing a critical dimension or line width as a function of focus for at least two different angles of incidence of the illumination beam with respect to the reticle.

2. The method according to claim 1, wherein receiving focus conditions comprises receiving an iso-sciatic point for the lithographic processing, the iso-sciatic point being a point of constant shadow for an illumination beam on a reticle.

3. The method according to claim 1, wherein the determining image performance effects comprises determining system related aberrations.

4. The method according to claim 1, wherein the determining image performance effects comprises evaluating the image performance effects with respect to a predetermined image performance level.

5. The method according to claim 1, wherein the method further comprises:
   receiving second values for the set of lithographic processing system parameters and the reticle parameters,
   receiving focus conditions allowing separation of image performance effects due to system aberrations and image performance effects due to reticle shadowing effects for the lithographic processing determined by the second values,
   determining at least one of the image performance effects due to system aberrations and the image performance effects due to reticle shadowing effects, and
   ranking the lithographic processing determined by the second values for the set of lithographic processing system parameters and the reticle parameters, with respect to the lithographic processing determined by the first values for the set of lithographic processing system parameters and reticle parameters.

6. The method of claim 1, wherein the information expressing a critical dimension or line width as a function of focus comprises a Bossung curve.

7. The method of claim 1, wherein the angle of incidence of the illuminations beam comprise an effective shadowing angle.

8. The method of claim 1, wherein the lithographic processing system uses electromagnetic radiation with short wavelengths.

* * * * *